(12) United States Patent
Itoh et al.

(10) Patent No.: US 8,444,772 B2
(45) Date of Patent: May 21, 2013

(54) LIQUID PROCESSING APPARATUS

(75) Inventors: Norihiro Itoh, Kumamoto (JP); Hiromitsu Nanba, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 683 days.

(21) Appl. No.: 12/371,126

(22) Filed: Feb. 13, 2009

(65) Prior Publication Data

US 2009/0205155 A1 Aug. 20, 2009

(30) Foreign Application Priority Data

Feb. 14, 2008 (JP) .................................. 2008-33522

(51) Int. Cl.
*B08B 3/00* (2006.01)
*B08B 1/02* (2006.01)
*A47L 7/00* (2006.01)

(52) U.S. Cl.
USPC .............. 134/26; 134/32; 134/95.1; 134/902; 15/320

(58) Field of Classification Search
USPC ................... 15/102; 134/902, 26, 32, 95.1
See application file for complete search history.

(56) References Cited

U.S. PATENT DOCUMENTS

| 6,405,739 | B1 * | 6/2002 | Liu ............................... 134/149 |
| 6,578,853 | B1 * | 6/2003 | Treur et al. .................... 279/121 |
| 6,742,279 | B2 * | 6/2004 | Lubomirsky et al. ........... 34/317 |

FOREIGN PATENT DOCUMENTS

| JP | 62-164347 A | 7/1987 |
| JP | 09-290197 A | 11/1997 |
| JP | 2001-44159 A | 2/2001 |
| JP | 2001044159 A | * 2/2001 |
| JP | 2001-156036 A | 6/2001 |
| JP | 2007-287999 A | 11/2007 |
| JP | 2007287999 A | * 11/2007 |

OTHER PUBLICATIONS

Notice of Reason for Rejection for Japanese Application No. 2008-033522 with English translation dated Jun. 7, 2010.

* cited by examiner

*Primary Examiner* — Bryan R Muller

(74) *Attorney, Agent, or Firm* — Abelman, Frayne & Schwab

(57) ABSTRACT

A liquid processing apparatus, capable of preventing a cleaning solution from remaining on a lifting member of a target object, thereby preventing an attachment of a cleaning solution to an opposite surface of a target object, and preventing an inflow of the cleaning solution into an inert gas supply part to efficiently supply the inert gas to the object, is disclosed. The liquid processing apparatus includes a hollow-shaped support plate to support an object, a hollow-shaped rotary shaft fixedly connected to the support plate, a rotary drive part to rotate the rotary shaft in a predetermined rotating direction, and a lift pin plate arranged in a hollow of the support plate to have lift pins supporting a main body and the processed object. A cleaning solution supply part to supply a cleaning solution and an inert gas supply part to supply an inert gas are extended in a hollow of the rotary shaft. The lift pin plate includes an inclined surface, and the front end of the inert gas supply part is positioned in a position higher than that of the front end of the cleaning solution supply part.

8 Claims, 10 Drawing Sheets

LIQUID PROCESSING APPARATUS

This application is based on and claims priority from Japanese Patent Application No. 2008-33522, filed on Feb. 14, 2008 in the Japanese Patent Office, the disclosure of which is incorporated herein in its entirety by reference.

TECHNICAL FIELD

The present invention relates to a liquid processing apparatus which can clean a target object by supplying a cleaning solution to the target object, while rotating the target object.

BACKGROUND

Liquid processing apparatuses include a hollow-shaped bottom plate supporting a target semiconductor wafer (hereinafter referred to as a "wafer"), a rotary shaft fixedly connected to the bottom plate and rotated by a spin motor, a supply pipeline extended in the rotary shaft to supply a cleaning solution to the wafer supported on the bottom plate, and substrate lifting pins ascending to support the bottom of the wafer. One example of the liquid processing apparatuses is disclosed in Japanese Unexamined Patent Publication No. Hei 9-290197

In the liquid processing apparatuses, a cleaning solution, such as a chemical solution or a rinsing solution, that is used to clean wafers, may be attached to the substrate lifting pins via through holes. Accordingly, when the wafer is lifted by the substrate lifting pins and is delivered to a conveyor robot after the wafer is dried, the droplet of the cleaning solution attached to the substrate lifting pins may be attached to an opposite surface of the wafer.

If the cleaning solution is attached to the wafer as described above, not only watermarks may be formed on the wafer to which the droplet is attached, but also the humidity in a carrier for conveying the wafer may be increased, thereby causing the formation of watermarks on other wafers accommodated in the carrier.

Further, in the liquid processing apparatuses, a first path connected to an inert gas connection path and a second path connected to a cleaning solution connection path are installed inside a dual supply pipeline, and the front ends of the first path and the second path are positioned at the same height. Accordingly, the cleaning solution may flow into the first path.

SUMMARY

The present invention provides a liquid processing apparatus which can prevent a cleaning solution from remaining on a lifter of a target object. Thus, the liquid processing apparatus according to the present invention can prevent an attachment of a cleaning solution to an opposite surface of a target object, and prevent an inflow of the cleaning solution into an inert gas supply part to efficiently supply the inert gas to the target object.

According to one example, a liquid processing apparatus is provided. The liquid processing apparatus includes a hollow-shaped support plate to support an object, a hollow-shaped rotary shaft fixedly connected to the support plate, a rotary drive part to rotate the rotary shaft in a predetermined rotating direction, a lift pin plate arranged in a hollow of the support plate, the lift pin including a main body of the lift pin plate and lift pins supporting the object, a cleaning solution supply part extended in a hollow of the rotary shaft to supply a cleaning solution to the object supported on the support plate, an inert gas supply part extended in the hollow of the rotary shaft to supply an inert gas to the object supported on the support plate, a lifting member to arrange the lift pin plate in an upper position or in a lower position by lifting the lift pin plate, and a solution discharge pipe to discharge the cleaning solution which has been used to clean the object. In some examples, the lift pin plate includes an inclined surface, and a front end of the inert gas supply part is positioned in a position higher than that of a front end of the cleaning solution supply part.

Accordingly, the cleaning solution can be prevented from remaining on the lift pin plate, and also prevented from being attached to an opposite surface of the object. Further, the cleaning solution can be prevented from flowing into the inert gas supply part, and the inert gas can be efficiently supplied to the object.

In some examples, the cleaning solution may be discharged through the solution discharge pipe by weight of the cleaning solution after the cleaning solution has cleaned the object.

The liquid processing apparatus may further include a suction device, and the cleaning solution may be discharged through the solution discharge pipe by a driving force received from the suction device after the cleaning solution has cleaned the object.

The inclined surface of the lift pin plate may descend toward a front end of the solution discharge pipe.

The inclined surface of the lift pin plate may descend toward an outer side of the main body of the lift pin plate.

The inclined surface of the lift pin plate may include an inner periphery part to descend toward the front end of the solution discharge pipe, and an outer periphery part positioned on an outer side of the edge of the inner periphery part to descend toward the outer side of the main body of the lift pin plate.

The lift pins may be installed on the outer side of the edge of a main body of the lift pin plate through a support part. A cross section of the support part may include a shape of a polygon, and a vertex angle of the polygon may look upward.

Accordingly, the cleaning solution can be prevented from remaining on the lift pins of the lift pin plate.

The inner periphery part of the support plate may include an inclined surface. The inclined surface may be inclined at the approximately same angle as that of the inclined surface of the lift pin plate. The inclined surface may be positioned on the same planes as the inclined surface of the lift pin plate.

Accordingly, the cleaning solution can be efficiently shaken off by rotating the support plate, and air fluctuation can be prevented.

According to the present invention, since the lift pin plate includes an inclined surface, the cleaning solution is prevented from remaining on the lift pin plate and from being attached to the opposite surface of an object. Also, since the front end of the inert gas supply part is positioned in a position higher than that of the front end of the cleaning solution supply part, the cleaning solution is prevented from flowing into the inert gas supply part, and the inert gas can be efficiently supplied to the object.

DETAILED DESCRIPTION

In the following detailed description, reference is made to the accompanying drawing, which form a part hereof. The illustrative embodiments described in the detailed description, drawing, and claims are not meant to be limiting. Other embodiments may be utilized, and other changes may be made, without departing from the spirit or scope of the subject matter presented here.

First Example

Figure 4:
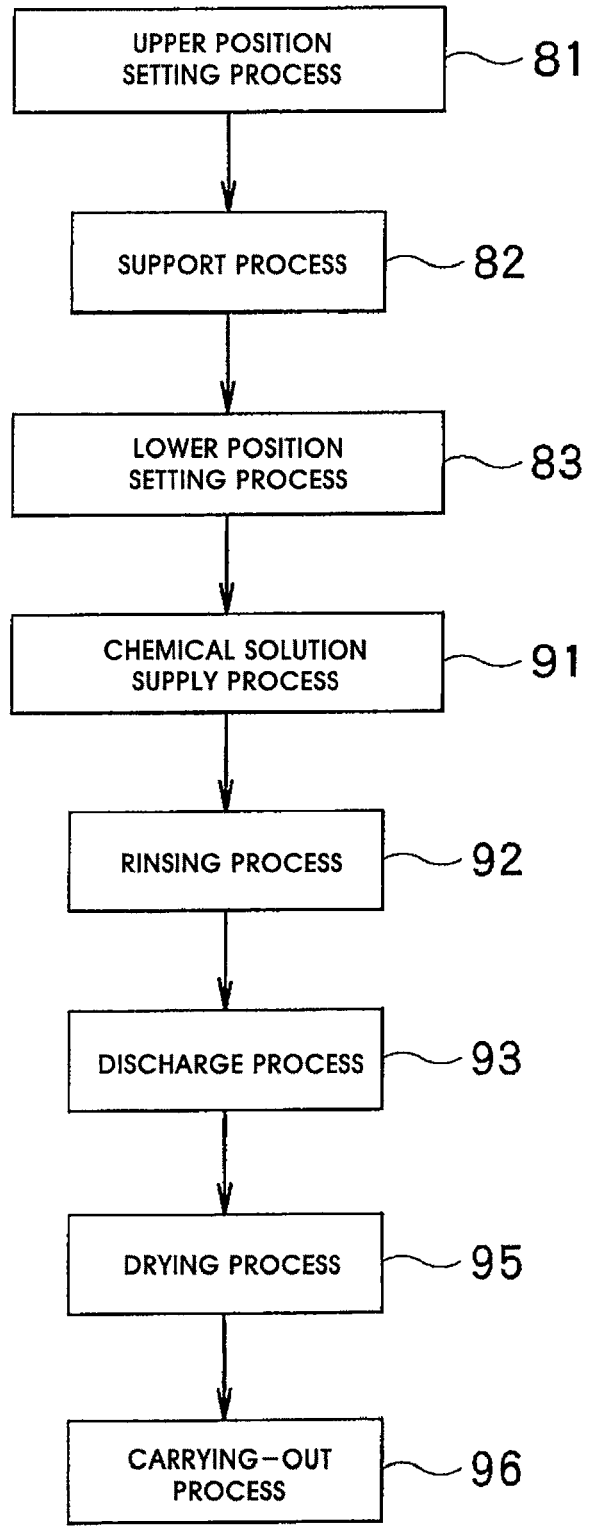
FIG. 4 is a flowchart illustrating a liquid processing method of a liquid processing apparatus according to a first example of the present invention.

Hereinafter, a liquid processing apparatus and method according to a first example of the present invention will be described with reference to the accompanying drawings. FIGS. 1, 2, 3 and 5 are views each illustrating the liquid processing apparatus according to the first example, and FIG. 4 is a flowchart illustrating the liquid processing method according to the first example.

Figure 1:
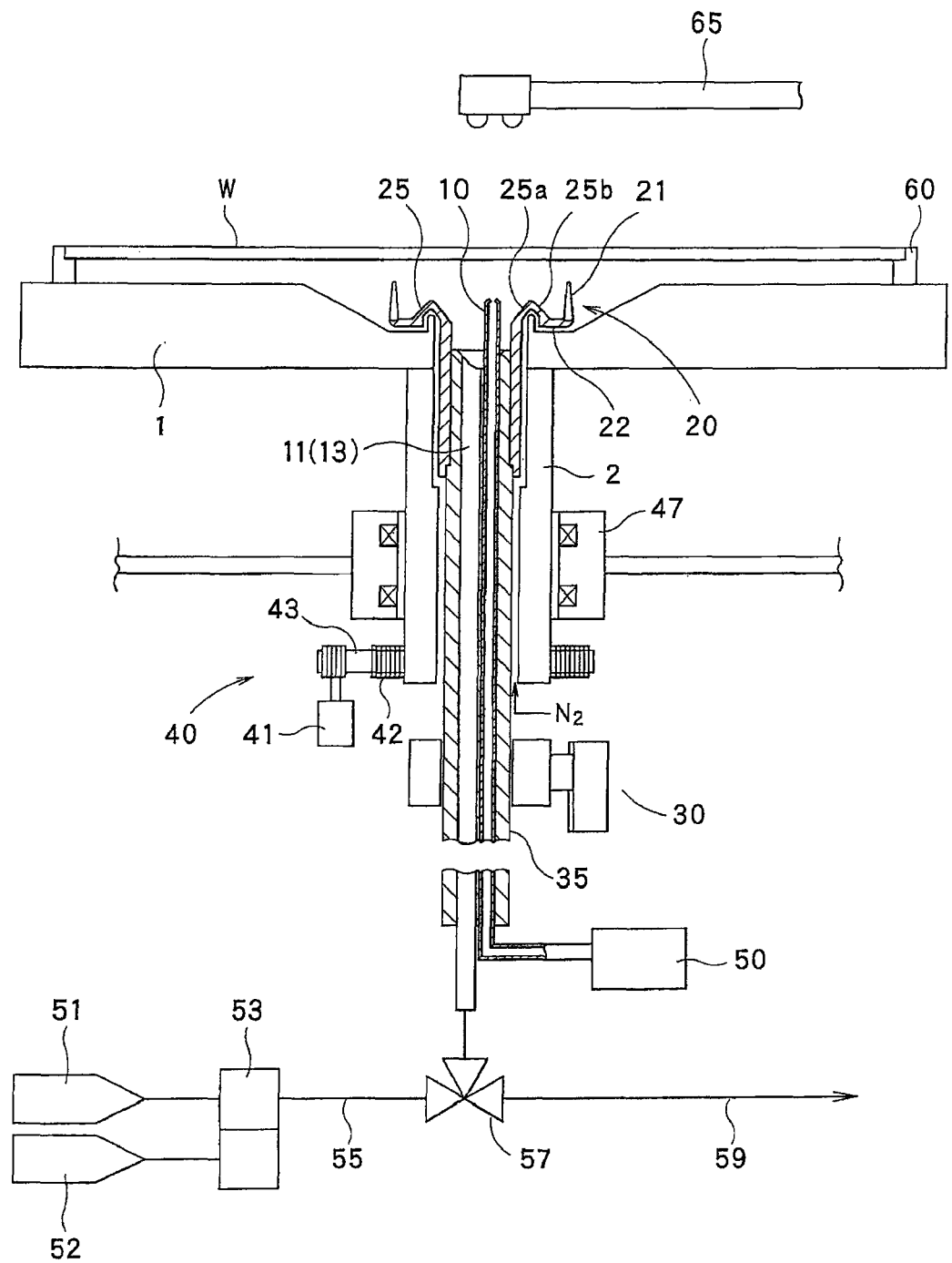
FIG. 1 is a side sectional view illustrating a liquid processing apparatus according to a first example of the present invention.

As illustrated in FIG. 1, the liquid processing apparatus includes a hollow-shaped support plate 1, a hollow-shaped rotary shaft 2 fixedly connected to the hollow-shaped support plate 1, and a rotary drive part 40 rotating the rotary shaft 2 in a predetermined rotating direction. The hollow-shaped support plate 1 includes a support member 60 to support a target semiconductor wafer (hereinafter referred to as a "wafer") W.

Also, the liquid processing apparatus includes a bearing 47 arranged around an outer side of an edge of the rotary shaft 2. The rotary drive part 40 includes a pulley 42 arranged on the outer side of the edge of the rotary shaft 2, and a motor 41 to apply a drive force to the pulley 42 through a drive belt 43.

Figure 2:
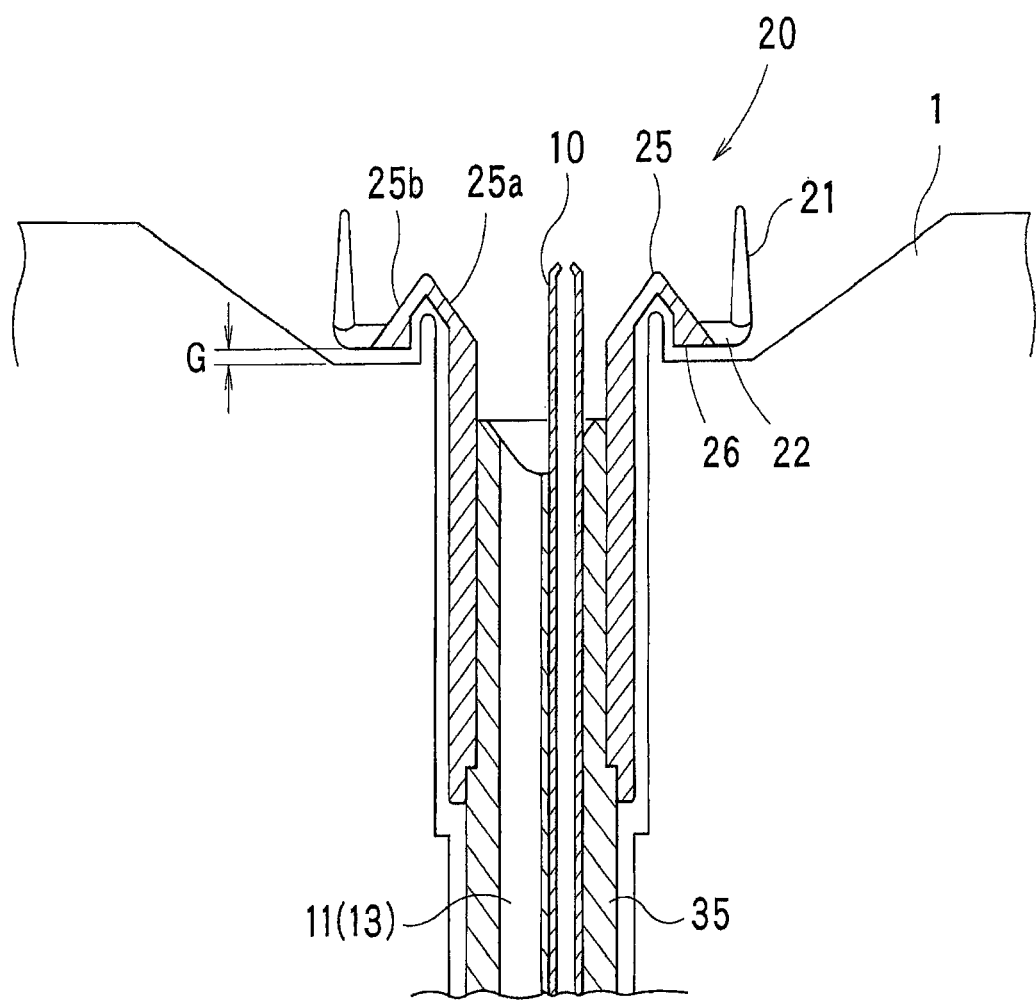
FIG. 2 is an enlarged side sectional view illustrating a liquid processing apparatus according to a first example of the present invention.
Figure 3:
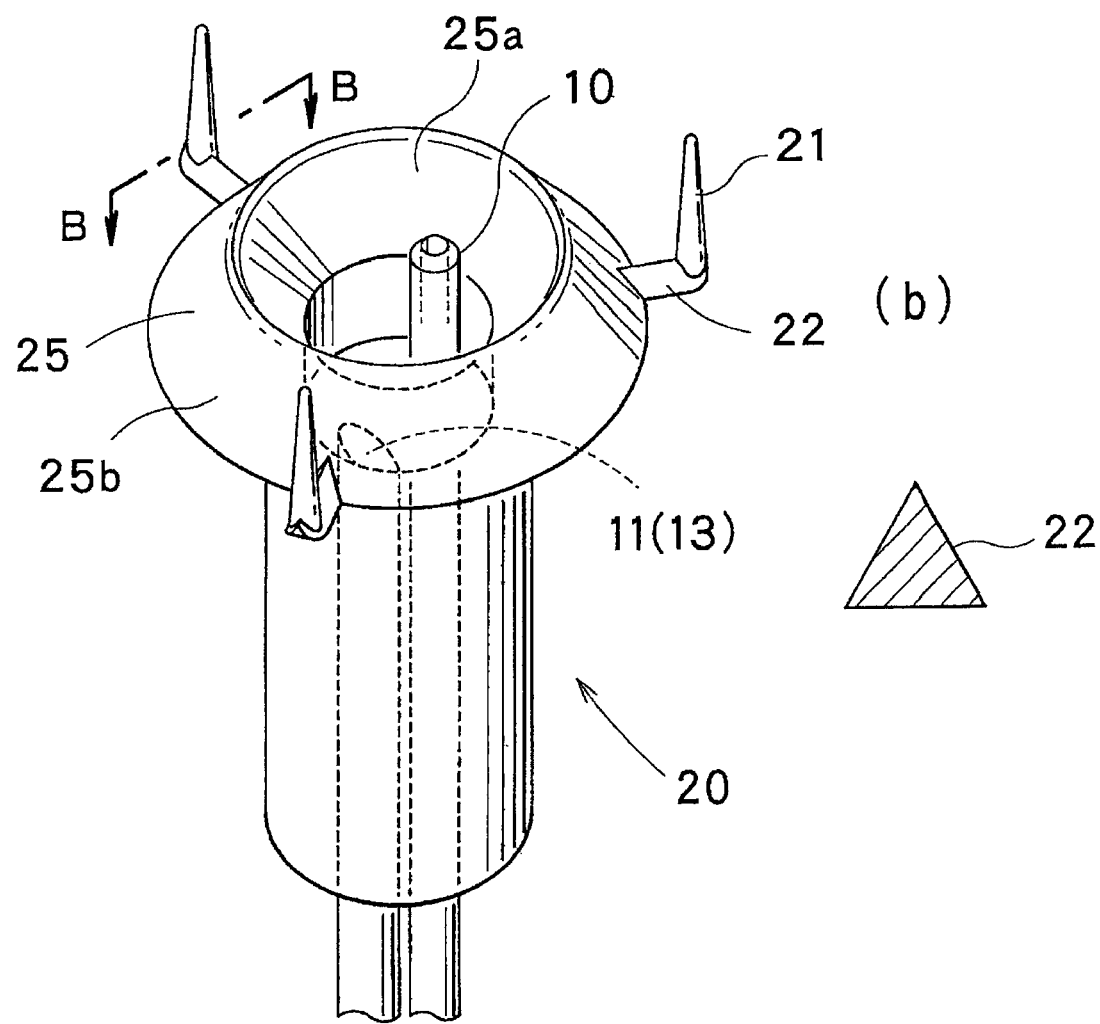
FIG. 3A is a perspective view illustrating a lift pin plate of a liquid processing apparatus according to a first example of the present invention.
FIG. 3B is a sectional view illustrating a support part of a lift pin plate of a liquid processing apparatus according to a first example of the present invention

As illustrated in FIGS. 1 and 2, a main body 25 and a lift pin plate 20 are arranged in a hollow of the support plate 1. The main body 25 includes inclined surfaces 25a and 25b. The lift pin plate 20 includes lift pins 21. The inclined surfaces 25a and 25b include an inclined surface 25a of an inner periphery part and an inclined surface 25b of an outer periphery part. The inclined surface 25a of the inner periphery part descends toward a front end of a solution discharge pipe 13. The inclined surface 25b of the outer periphery part is positioned on the outer side of the edge of the inclined surface 25a of the inner periphery part and descends toward the outer side of the edge.

As illustrated in FIGS. 1 to 3A, the lift pin 21 is installed on an outer side of an edge of the main body 25 of the lift pin plate 20 through a support part 22. The cross section of the support part 22 has a shape of a triangle, and a vertex angle of the triangle forming an acute angle looks upward (See FIG. 3B). FIG. 3B is a sectional view taken along line B-B of FIG. 3A.

As illustrated in FIG. 1, a support shaft 35 is fixedly connected to the lift pin plate 20, and it extends upwardly and downwardly in the hollow of the rotary shaft 2. Also, a lift member 30 is installed on the support shaft 35, as illustrated in FIG. 1. The lift member 30 lifts and places the lift pin plate 20 and the support shaft 35 in an upper position or in a lower position.

As illustrated in FIG. 2, when the lift pin plate 20 is in the lower position, a gap G is formed between the lift pin plate 20 and the support plate 1. In order to prevent the inflow of a cleaning solution such as a chemical solution or a rinsing solution through the gap G, a gas such as $N_2$ is blown (or spread) out from the gap G.

As illustrated in FIGS. 1 and 2, a lower projection part 26 is provided on an edge part of the main body 25 of the lift pin plate 20. Also, by narrowing the gap G by the lower projection part 26, the cleaning solution is prevented from introducing between the lift pin plate 20 and the support plate 1.

Also, the support shaft 35 and the lift pin plate 20 are in a hollow shape. An opposite-side cleaning solution supply pipe (i.e. cleaning solution supply part) 11 is provided to the liquid processing apparatus to supply the cleaning solution to an opposite surface of the wafer W supported on the support plate 1. The opposite-side cleaning solution supply pipe 11 extends upwardly and downwardly in the inside (i.e. in a hollow space) the support shaft 35 and the lift pin plate 20.

As illustrated in FIG. 1, a supply pipe 55 is connected to the opposite-side cleaning solution supply pipe 11 through a three-way valve 57. The supply pipe 55 is also connected to a chemical solution supply source 51 to supply a chemical solution and a rinsing solution supply source 52 to supply a rinsing solution through a supply switching part 53.

An opposite-side cleaning solution supply equipment includes the opposite-side cleaning solution supply pipe 11, the supply pipe 55 connected to the opposite-side cleaning solution supply pipe 11 through the three-way valve 57, the chemical solution supply source 51 and the rinsing solution supply source 52 connected to the supply pipe 55 (See FIG. 1).

However, the opposite-side cleaning solution supply pipe 11 also serves as the solution discharge pipe 13 to discharge the cleaning solution which has been used to clean the wafer W supported on the support plate 1. That is, as illustrated in FIG. 1, a discharge pipe 59 communicated to an outside is connected to the opposite-side cleaning solution supply pipe 11 through the three-way valve 57. Accordingly, the opposite-side cleaning solution supply pipe 11 serves as the solution discharge pipe 13 in a state that one side of the three-way valve 57 facing the supply pipe 55 is closed and another side of the three-way valve 57 facing the discharge pipe 59 is opened.

As illustrated in FIGS. 1 and 2, an inert gas supply pipe (i.e. inert gas supply part) 10 is provided to the liquid processing apparatus to supply an inert gas (i.e., drying gas) such as $N_2$ to the opposite surface of the wafer W supported on the support plate 1. The inter gas supply pipe 10 extends upwardly and downwardly in the inside (i.e. in the hollow space) the support shaft 35 and the lift pin plate 20. Also, as illustrated in FIGS. 1 and 3A, the front end (i.e. upper end) of the inert gas supply pipe 10 is positioned in a position higher than the front end (i.e. upper end) of the opposite-side cleaning solution supply pipe 11. An opening of the inert gas supply pipe 10 becomes narrower as it goes toward the front end thereof (See FIGS. 1 and 2). Accordingly, the inert gas supplied from the inert gas supply pipe 10 can be supplied to the opposite surface of the wafer W at high speed.

An inert gas supply equipment includes the inert gas supply pipe 10 and an inert gas supply source 50 connected to the inert gas supply pipe 10 (See FIG. 1).

As illustrated in FIG. 1, a surface-side cleaning solution supply part 65 is arranged on an upper side of the support plate 1 to supply the cleaning solution to the surface of the wafer W supported on the support plate 1.

The cleaning solution refers to a chemical solution or a rinsing solution. Examples of the chemical solution may include diluted fluoric acid, ammonia-hydrogen peroxide solution (SC1), hydrochloric acid-hydrogen peroxide solution (SC2), and the like. Examples of the rinsing solution may include deionized water (DIW), and the like.

Also, a drying solution, composed of, for example, isopropyl alcohol (IPA), is supplied from the surface-side cleaning solution supply part 65.

Hereinafter, referring to FIGS. 1 and 4, the operation of the liquid processing apparatus as illustrated above will be described.

First, the lift member 30 sets the lift pin plate 20 in an upper position (i.e. a position where a wafer conveyor robot delivers the wafer W) (an upper position setting process 81) (See FIG. 4). The lift member 30 sets the support shaft 35 in the upper position. Thus the lift pin plate 20 fixedly connected to the support shaft 35 is positioned in the upper position.

The wafer W is transferred from the wafer conveyor robot (not illustrated) to the lift pins 21 of the lift pin plate 20, and is supported by the lift pins 21 (a support process 82) (See FIG. 4).

Then, the lift member 30 sets the lift pin plate 20 in a lower position (i.e. a position where the wafer W is processed by the cleaning solution) (a lower position setting process 83) (See FIGS. 1 and 4). The lift member 30 sets the support shaft 35 in the lower position. Thus, the lift pin plate 20 fixedly connected to the support shaft 35 is positioned in the lower position.

When the lift pin plate 20 is positioned in the lower position, the wafer W is supported by a support member 60 of the support plate 1 (a support process) (See FIG. 1).

Then, the rotary shaft 2 is rotated by the rotary drive part 40, and thus the wafer W supported on the support plate 1 is rotated (a rotating process).

While the wafer W supported on the support plate 1 and the lift pin plate 20 are rotated, the following processes are performed.

By using the surface-side cleaning solution supply part 65 and the opposite-side cleaning solution supply equipment, a chemical solution is supplied to the wafer W (a chemical solution supply process 91) (See FIGS. 1 and 4). That is, the surface-side cleaning solution supply part 65 supplies the chemical solution to the surface of the wafer W. The opposite-side cleaning solution supply equipment supplies the chemical solution (i.e. from the opposite-side cleaning solution supply pipe 11) to the opposite surface of the wafer W. At this time, the chemical solution is supplied from the chemical solution supply source 51 to the supply pipe 55 through the supply switching part 53.

Then, by using the surface-side cleaning solution supply part 65 and the opposite-side cleaning solution supply equipment, the rinsing solution is supplied to the wafer W (a rinsing process 92) (See FIGS. 1 and 4). For example, the surface-side cleaning solution supply part 65 supplies the rinsing solution to the surface of the wafer W. The opposite-side cleaning solution supply equipment supplies the rinsing solution (i.e. from the opposite-side cleaning solution supply pipe 11) to the opposite surface of the wafer W. At this time, the rinsing solution is supplied from the rinsing solution supply source 52 to the supply pipe 55 through the supply switching part 53.

In the chemical solution supply process 91 and the rinsing process 92 as described above, since the main body 25 of the lift pin plate 20 includes the inclined surfaces 25a and 25b, it prevents the cleaning solution such as the chemical solution or the rinsing solution from remaining on the main body 25. Also, by preventing the cleaning solution from remaining on the main body 25, it prevents the cleaning solution from remaining on the lift pins 21 for lifting the wafer W.

In one example of the present invention, the lift pins 21 are installed on the outer side of the edge of the main body 25 of the lift pin plate 20 through the support part 22. Also, the cross section of the support part 22 has a shape of a triangle, and a vertex angle of the triangle forming an acute angle looks upward (See FIGS. 3A and 3B). Accordingly, the cleaning solution is prevented from moving from the main body 25 to the lift pins 21, and thus the cleaning solution is prevented from remaining on the lift pins 21 for lifting the wafer W.

As illustrated in FIGS. 1 and 2, since the front end of the inert gas supply pipe 10 is positioned in a position higher than that of the front end of the opposite-side cleaning solution supply pipe 11, the cleaning solution, such as the chemical solution or the rinsing solution, being supplied from the opposite-side cleaning solution supply pipe 11, is prevented from flowing into the inert gas supply pipe 10.

In the rinsing process 92, the amount of rinsing solution, being supplied from the opposite-side cleaning solution supply equipment to the opposite surface of the wafer W, becomes smaller in the middle of the process. Thereafter, the rinsing solution supplied from the opposite-side cleaning solution supply equipment is stored in the main body 25 of the lift pins 21.

When the rinsing process 92 has been completed, the three-way valve 57 is switched over, and the opposite-side cleaning solution supply pipe 11 is communicated to the discharge pipe 59 to serve as the solution discharge pipe 13. The rinsing solution whish has been used to clean the wafer W is discharged through the solution discharge pipe 13 by weight of the rinsing solution itself (a discharge process 93) (See FIGS. 1 and 4). Here, since the rinsing solution is discharged through the solution discharge pipe 13 after the rinsing solution is once stored in the main body 25 of the lift pins 21, the droplet attached to the main body 25 of the lift pins 21 can be clearly wiped off.

If the rinsing solution is discharged as described above, a drying solution composed of, for example, isopropyl alcohol (IPA) is supplied from the surface-side cleaning solution supply part 65, and an inert gas (i.e. drying gas) composed of, for example, $N_2$ is supplied from the inert gas supply pipe 10 of the inert gas supply equipment to the opposite surface of the wafer W (a drying process 95) (See FIGS. 1 and 4).

Since the front end of the inert gas supply pipe is positioned in a position higher than that of the front end of the opposite-side cleaning solution supply pipe 11, and is adjacent to the opposite surface of the wafer W, the inert gas can reach the opposite surface of the wafer W before its current speed is lowered. Accordingly, the inert gas can be efficiently supplied to the opposite surface of the wafer W.

If the drying process 95 has been completed, the wafer W is lifted by the lift pins 21 of the lift pin plate 20, and is moved to the wafer conveyor robot (a carrying-out process 96) (See FIG. 4).

Here, as described above, no cleaning solution remains on the lift pins 21 and the main body 25. Accordingly, when the wafer W is lifted by the lift pins 21 of the lift pin plate 20, any droplet of the cleaning solution remaining on the lift pins 21 and any droplet of the cleaning solution stored in the main body 25 are not attached to the opposite surface of the wafer W.

As a result, it can prevent watermarks from being formed on the wafer W to which the droplet is attached, and can also prevent watermarks from being formed on other wafers W accommodated in a carrier (not illustrated) for conveying the wafers W.

Also, for example, the main body 25 of the lift pin plate 20 and an upper surface part of the support plate are made of a hydrophillic material, such as, polyether ether ketone (PEEK). By forming the main body 25 of the lift pin plate 20 and the upper surface part of the support plate 1 with such a hydrophillic material, the height of the droplet of the cleaning solution can be lowered, even if the droplet still remains on the lift pins 21 and the main body 25. Further, the droplet of the cleaning solution can be surely prevented from being attached to the opposite surface of the wafer W.

Although it is described as one example that the cross section of the support part 22 has a shape of a triangle and the vertex angle of the triangle forming an acute angle looks upward, the feature of the support part 22 is not limited thereto. The cross section of the support part 22 may have a shape of a polygon, and the vertex angle of the polygon may look upward. For example, the cross section of the support part 22 may be formed of a square or a pentagon, and the vertex angle thereof may not form an acute angle. However, the vertex angle looking upward may form an acute angle since the cleaning solution can be more efficiently prevented from being moved from the main body 25 to the lift pin 21.

Figure 5:
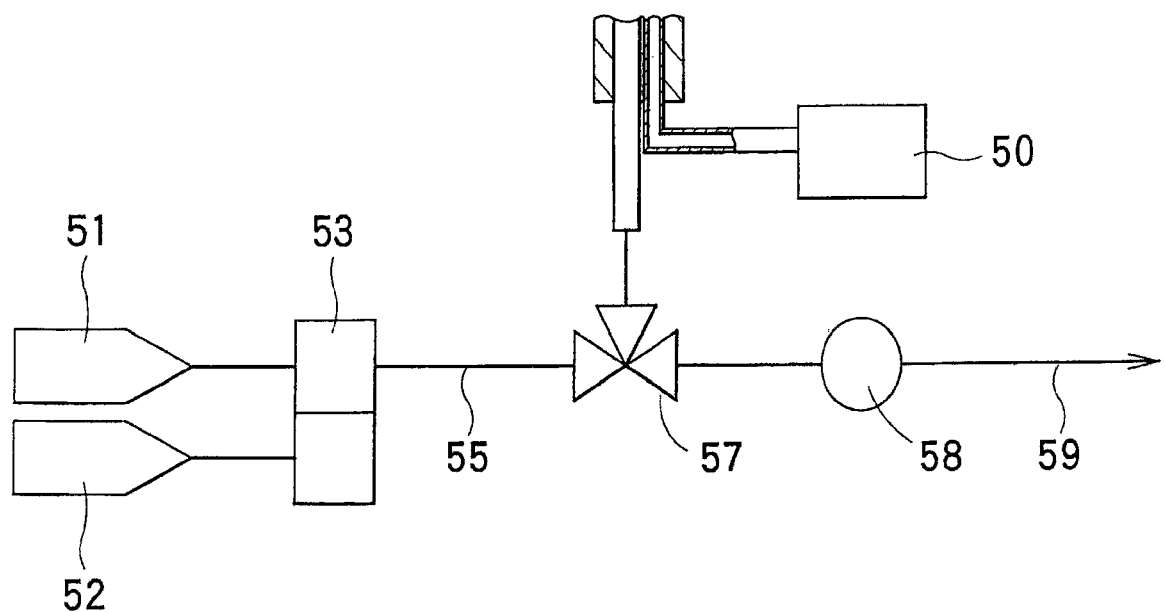
FIG. 5 is a side sectional view illustrating a part of a liquid processing apparatus according to another first example of the present invention.

Also, although it is described as one example that the rinsing solution which has cleaned the wafer W is discharged through the solution discharge pipe 13 by weight of the rinsing solution itself, the discharging feature is not limited thereto. For example, as illustrated in FIG. 5, a suction device 58 composed of, for example, an aspirator may be installed in the discharge pipe 59. The cleaning solution which has been used to clean the wafer W is discharged through the solution discharge pipe 13 by a driving force of the suction device 58. By using such a suction device 58, the cleaning solution can be discharged more efficiently.

Second Example

Hereinafter, a liquid processing apparatus and method according to a second example of the present invention will be described with reference to FIGS. 6 to 8. The liquid processing apparatus and method according to the second example of the present invention as illustrated in FIGS. 6 to 8 are substantially the same as those according to the first example of the present invention as illustrated in FIGS. 1 to 5 except that the shape of the lift pin plate 20 is changed.

Figure 6:
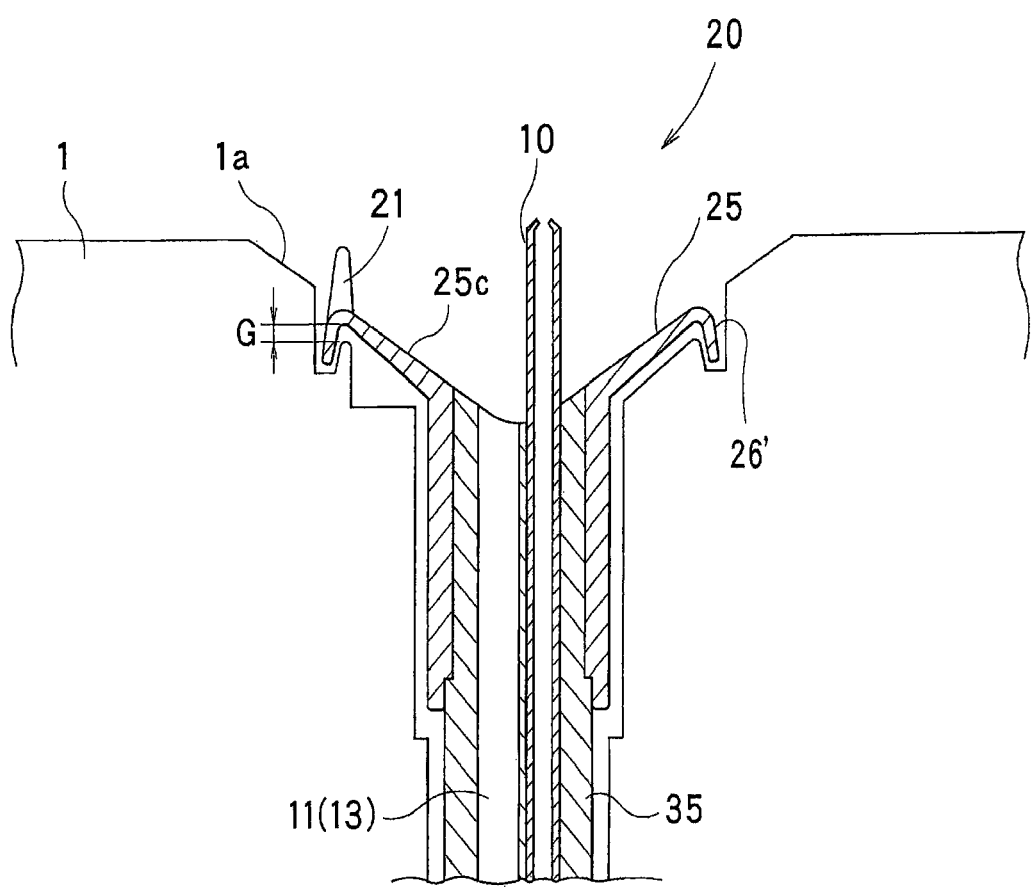
FIG. 6 is an enlarged side sectional view illustrating a liquid processing apparatus according to a second example of the present invention.
Figure 7:
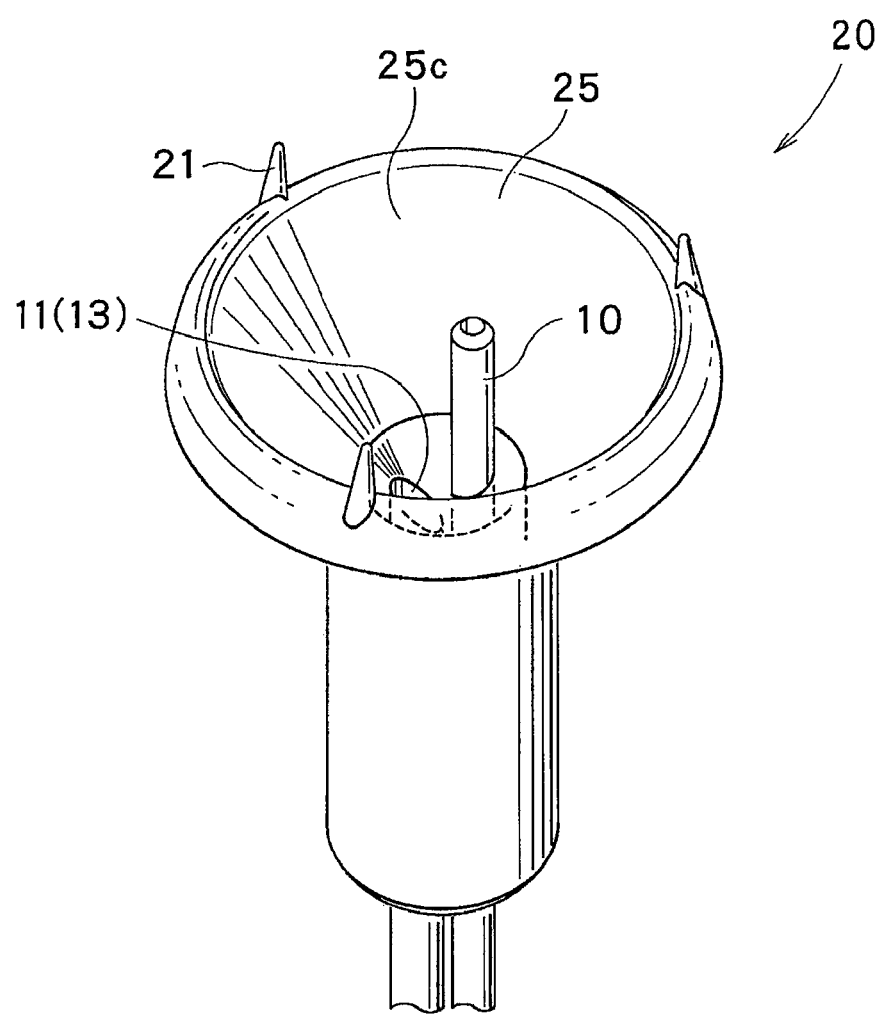
FIG. 7 is a perspective view illustrating a lift pin plate of a liquid processing apparatus according to a second example of the present invention.
Figure 8:
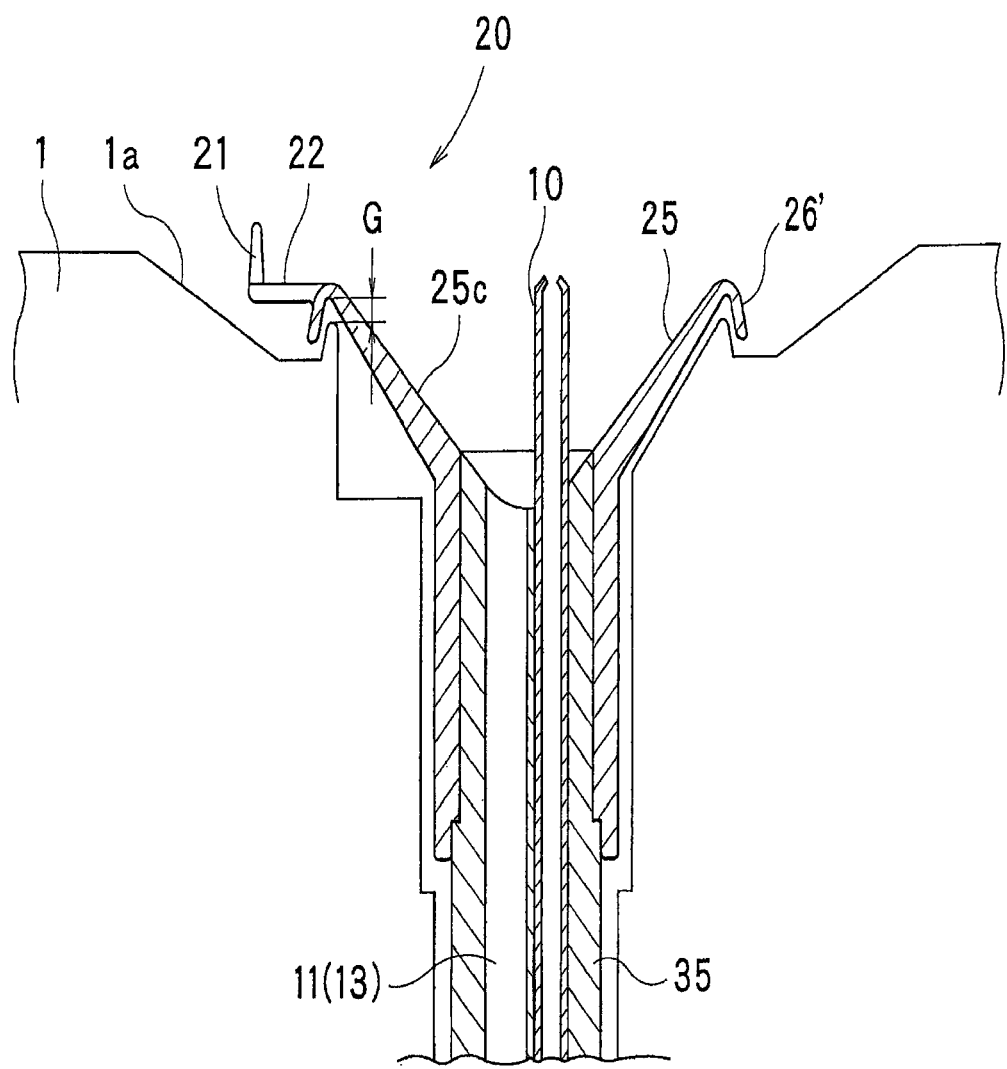
FIG. 8 is an enlarged side sectional view illustrating a liquid processing apparatus according to another second example of the present invention.

In the second example of the present invention as illustrated in FIGS. 6 to 8, the same drawing reference numerals are used for the same elements as those according to the first example of the present invention as illustrated in FIGS. 1 to 5, and the detailed description thereof will be omitted.

As illustrated in FIGS. 6 and 7, the inclined surface 25c of the main body 25 of the lift pin plate 20 descends toward the front end of the solution discharge pipe 13. Also, a lower projection part 26' is provided in the edge part of the main body 25 of the lift pint plate 20 to prevent the inflow of the cleaning solution from the gap G.

The second example of the present invention may have the same effects as those of the first example of the present invention as follows.

As illustrated in FIGS. 6 and 7, since the lift pin plate 20 provided with the lift pins 21 has the inclined surface 25c, the cleaning solution, such as the chemical solution or the rinsing solution, is prevented from remaining on the main body 25 of the lift pin plate 20 during the chemical solution supply process 91 and the rinsing process 92.

As illustrated in FIG. 6, the inner periphery part of the support plate 1 includes an inclined surface 1a which is inclined at the approximately same angle as that of the inclined surface 25c of the lift pin plate 20, and is positioned on the same plane as the inclined surface 25c of the lift pin plate 20. Accordingly, in the drying process 95, the cleaning solution can be efficiently shaken off by rotating the support plate 1, and an air stream can be prevented from being fluctuated.

As illustrated in FIGS. 6 and 7, since the front end of the inert gas supply pipe 10 is positioned in a position higher than that of the front end of the opposite-side cleaning solution supply pipe 11, the cleaning solution, such as the chemical solution or the rinsing solution, being supplied from the opposite-side cleaning solution supply pipe 11, can be prevented from flowing into the inert gas supply pipe 10.

Also, since the front end of the inert gas supply pipe 10 is positioned in a position which is higher than that of the front end of the opposite-side cleaning solution supply pipe 11 and is adjacent to the opposite surface of the wafer W, the inert gas can reach the opposite surface of the wafer W before its current speed is lowered during the drying process 95. Accordingly, the inert gas can be efficiently supplied to the opposite surface of the wafer W.

In this example of the present invention, the upper surface part of the main body 25 of the lift pin plate 20 may be made of a hydrophobic material, such as, polytetrafluoroethylene (PTFE). By forming the upper surface part of the main body 25 of the lift pin plate 20 using the hydrophobic material, the cleaning solution is drained well, and thus the cleaning solution is prevented from remaining on the lift pin plate 20.

In the same manner as the first example of the present invention, the lift pins 21 of the lift pin plate 20 may be installed on the main body 25 through the support part 22 (See FIG. 8). Here, the cross section of the support part 22 has a shape of a triangle (a polygon), and the vertex angle of the triangle looks upward in the same manner as the first example of the present invention. In the example of the present invention as illustrated in FIG. 8, the inclined surface 1a, which is positioned on the inner periphery part of the support plate 1, may not be positioned on the same plane as the inclined surface 25c of the lift pin plate 20, and may be inclined at an angle different from that of the inclined surface 25c of the lift pin plate 20.

As described above, by installing the lift pins 21 on the main body 25 through the support part 22 in the same manner as the first example of the present invention, the cleaning solution is prevented from moving from the main body 25 to the lift pins 21, and thus the cleaning solution is effectively prevented from remaining on the lift pins 21 for lifting the wafer W.

Third Example

Hereinafter, a liquid processing apparatus and method according to a third example of the present invention will be described with reference to FIGS. 9 and 10. The liquid processing apparatus and method according to the third example of the present invention as illustrated in FIGS. 9 and 10 are substantially the same as those according to the first example of the present invention as illustrated in FIGS. 1 to 5, except that the shape of the lift pin plate 20 is changed.

Figure 9:
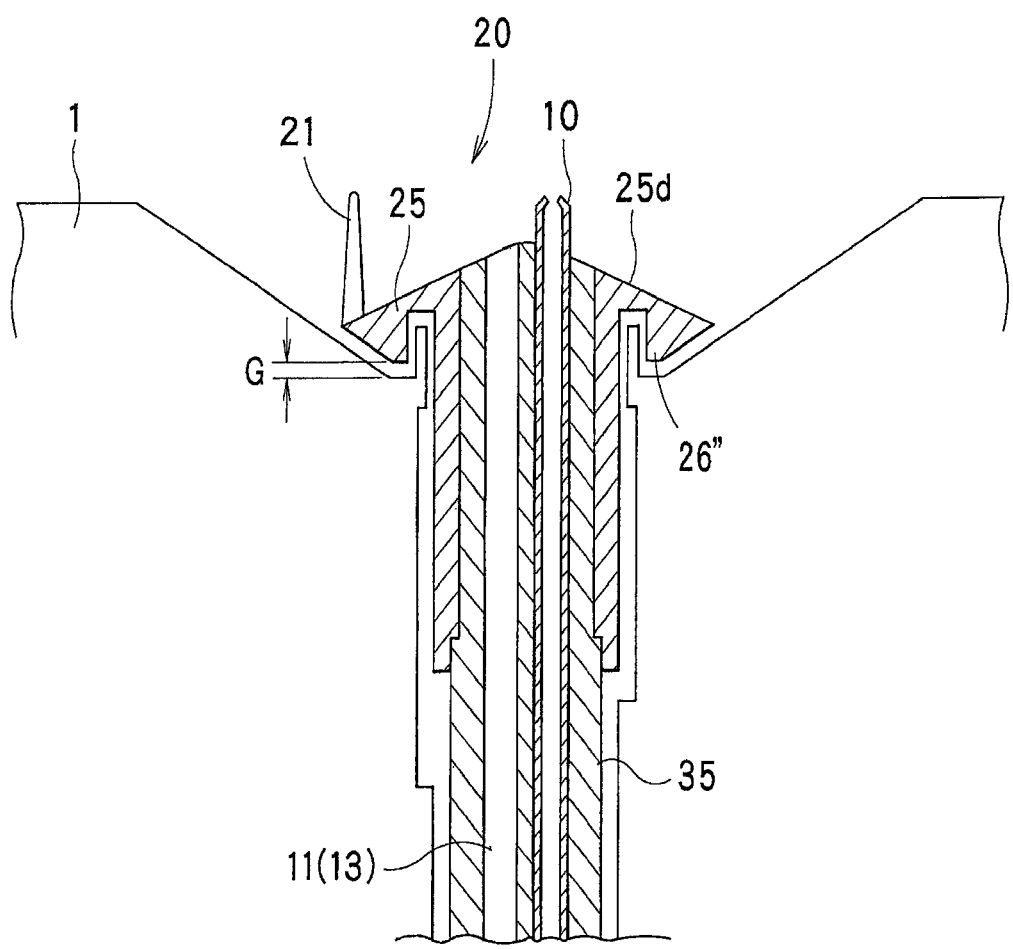
FIG. 9 is an enlarged side sectional view illustrating a liquid processing apparatus according to a third example of the present invention.
Figure 10:
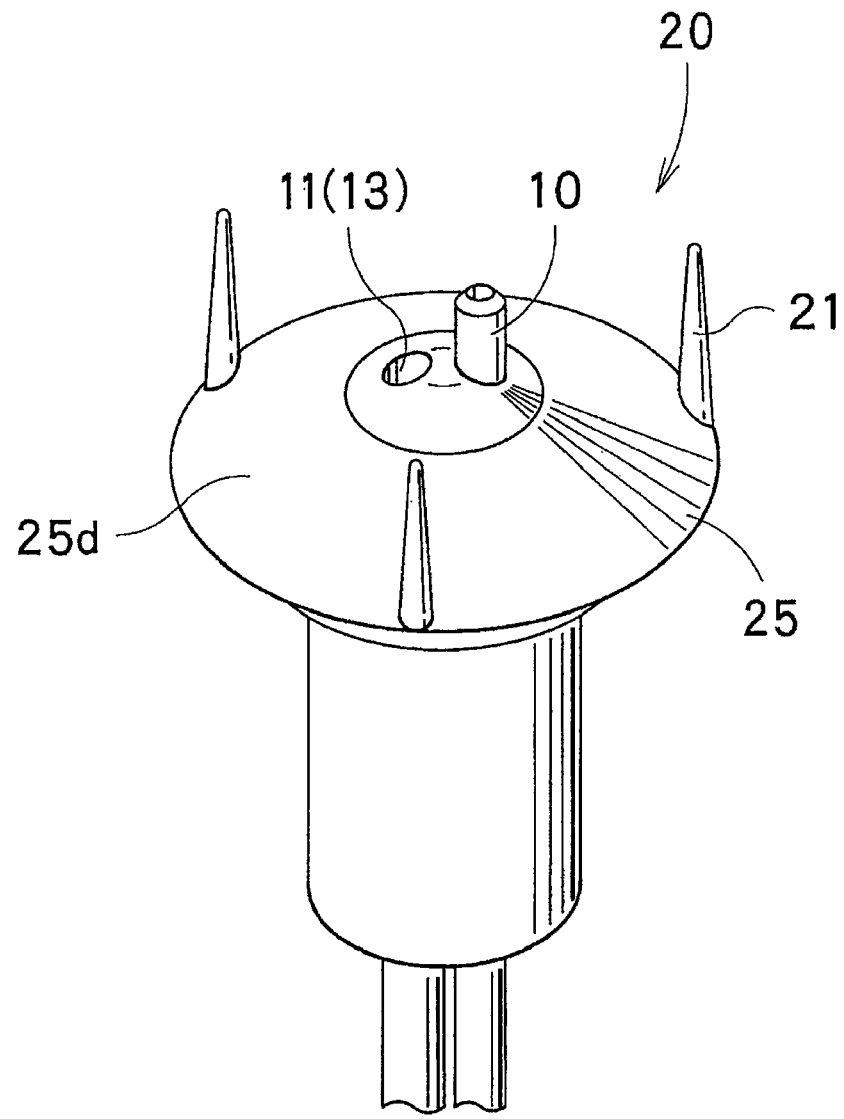
FIG. 10 is a perspective view illustrating a lift pin plate of a liquid processing apparatus according to a third example of the present invention.

In the third example of the present invention as illustrated in FIGS. 9 and 10, the same drawing reference numerals are used for the same elements as those according to the first example of the present invention as illustrated in FIGS. 1 to 5, and the detailed description thereof will be omitted.

As illustrated in FIGS. 9 and 10, the inclined surface 25d of the main body 25 of the lift pin plate 20 descends toward the outer side of the edge thereof. Also, a lower projection part 26" is provided in the edge part of the main body 25 of the lift pint plate 20 to prevent the inflow of the cleaning solution from the gap G.

The third example of the present invention has the same effects as those of the first example of the present invention as follows.

As illustrated in FIGS. 9 and 10, since the lift pin plate 20 provided with the lift pins 21 includes the inclined surface 25d, the cleaning solution, such as the chemical solution or the rinsing solution, is prevented from remaining on the main body 25 of the lift pin plate 20 during the chemical solution supply process 91 and the rinsing process 92.

Also, since the front end of the inert gas supply pipe 10 is positioned in a position higher than that of the front end of the opposite-side cleaning solution supply pipe 11, the cleaning solution, such as the chemical solution or the rinsing solution, being supplied from the opposite-side cleaning solution supply pipe 11, is prevented from flowing into the inert gas supply pipe 10.

Also, since the front end of the inert gas supply pipe 10 is positioned in a position which is higher than that of the front end of the opposite-side cleaning solution supply pipe 11 and is adjacent to the opposite surface of the wafer W, the inert gas can reach the opposite surface of the wafer W before its current speed is lowered during the drying process 95. Accordingly, the inert gas can be efficiently supplied to the opposite surface of the wafer W.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A liquid processing apparatus, comprising:
   a support plate to support an object, the support plate including an opening therethrough;
   a hollow-shaped rotary shaft fixedly connected to the support plate;
   a rotary drive part to rotate the rotary shaft in a predetermined rotating direction;
   a lift pin plate arranged in a hollow of the support plate, the lift pin plate including a main body of the lift pin plate and lift pins for supporting the object;
   a cleaning solution supply and discharge part extended in a hollow of the rotary shaft to supply a cleaning solution to the object supported on the support plate, and to discharge the cleaning solution which has been used to clean the object;
   an inert gas supply part extended in the hollow of the rotary shaft to supply an inert gas to the object supported on the support plate; and
   a lift member to arrange the lift pin plate in an upper position or in a lower position,
   wherein the lift pin plate includes at least one inclined surface relative to a plane defined by the upper surface of the support plate, and, when the lift pin plate is in the lower position, an uppermost end of the inert gas supply part is positioned to be higher than an uppermost end of the cleaning solution supply and discharge part, and to be higher than any of the at least one inclined surface of the lift pin plate.

2. The liquid processing apparatus of claim 1, wherein the solution supply and discharge part is configured to extend along a vertical direction so that the cleaning solution is discharged through the solution supply and discharge part by weight of the cleaning solution after the cleaning solution has cleaned the object.

3. The liquid processing apparatus of claim 1, further comprising a suction device, wherein the cleaning solution is discharged through the solution supply and discharge part by a driving force received from the suction device after the cleaning solution has cleaned the object.

4. The liquid processing apparatus of claim 1, wherein the inclined surface of the lift pin plate descends toward an upper end of the solution supply and discharge part which is an open end located adjacent to the lift pin plate.

5. The liquid processing apparatus of claim 1, wherein the inclined surface of the lift pin plate descends toward an outer side of the main body of the lift pin plate.

6. The liquid processing apparatus of claim 1, the inclined surface of the lift pin plate includes an inner periphery part to descend toward an upper end of the solution supply and discharge part which is an open end located adjacent to the lift pin plate, and an outer periphery part positioned on an outer side of an edge of the inner periphery part to descend toward the outer side of the main body of the lift pin plate.

7. The liquid processing apparatus of claim 1, wherein the inner periphery part of the support plate includes an inclined surface, and wherein the inclined surface is inclined at the approximately same angle as that of the inclined surface of the lift pin plate, and the inclined surface is positioned on the same planes as the inclined surface of the lift pin plate.

8. The liquid processing apparatus of claim 1, wherein the inert gas supply part has a hole that becomes narrower toward the uppermost end thereof.

* * * * *